United States Patent [19]

Ostteen et al.

[11] Patent Number: 5,294,937
[45] Date of Patent: Mar. 15, 1994

[54] CABLE LEAKAGE MONITORING SYSTEM

[75] Inventors: Michael E. Ostteen, Rowlett; Kenneth J. Eckenroth, Garland, both of Tex.

[73] Assignee: Cable Leakage Technologies, Richardson, Tex.

[21] Appl. No.: 886,687

[22] Filed: May 20, 1992

[51] Int. Cl.⁵ .......................... G01S 5/08; G01V 3/12
[52] U.S. Cl. .................... 342/459; 342/357; 324/326
[58] Field of Search ............... 324/326, 329, 539, 533, 324/537, 527-530, 531, 512; 342/357, 459; 340/650, 651, 652

[56] References Cited

U.S. PATENT DOCUMENTS

| | | | |
|---|---|---|---|
| 3,526,831 | 9/1970 | Smith | 324/326 |
| 4,060,718 | 11/1977 | Huddle | 364/421 |
| 4,072,899 | 2/1978 | Shimp | 455/4.1 |
| 4,390,836 | 6/1983 | Bruce et al. | 324/326 |
| 4,413,229 | 11/1983 | Grant | 324/528 |
| 4,733,356 | 3/1988 | Haeussermann et al. | 340/988 |
| 4,775,839 | 10/1988 | Kosina et al. | 324/530 |
| 4,814,711 | 3/1989 | Olsen et al. | 342/357 |
| 4,857,851 | 8/1989 | Anderson et al. | 324/326 |
| 4,924,450 | 5/1990 | Brashear et al. | 324/329 |
| 5,144,317 | 9/1992 | Dudder et al. | 342/357 |
| 5,155,490 | 10/1992 | Spradley, Jr. et al. | 342/357 |
| 5,182,566 | 1/1993 | Ferguson et al. | 342/357 |

Primary Examiner—Gregory C. Issing
Attorney, Agent, or Firm—James W. Huffman; David L. McCombs

[57] ABSTRACT

A cable leakage detection system to be placed in a moving vehicle for monitoring signal leakages in a cable television plant whereby an RF detection meter is combined with a global positioning system and a computer control unit to measure radio frequency signal strength, while maintaining the corrected distance between the vehicle and the source of the leak, determine longitude and latitude of the measured signal strength, and store the signal strength, longitude and latitude in data files.

22 Claims, 3 Drawing Sheets

CABLE LEAKAGE MONITORING SYSTEM

FIELD OF THE INVENTION

This invention relates in general to the field of test and monitoring of electromagnetic radiation and signal leakage. More specifically, the invention relates to a system for monitoring signal leakage in cable television plants.

BACKGROUND OF THE INVENTION

Cable television is a system for delivering television signals to subscribers or viewers by means of coaxial cable. For an installation charge and a monthly fee, cable television viewers receive a clear picture of local channels, as well as reception of several dozen additional channels including one or two devoted to movies, sports, news or special events. Originating in 1949 as a way of providing good signal reception to geographic areas where the conventional television signals were weak, cable spread quickly among rural municipalities, and can now be found servicing over half the television viewers in the United States.

In 1972, the Federal Communications Commission (FCC) adopted Rules and Regulations requiring cable television operators to obtain a certificate of compliance from the Commission prior to constructing or operating a cable television system. These rules covered a number of broad subjects such as franchising standards, signal carriage, network program duplication and syndication, non broadcast or cablecasting services, and technical standards. Since that time, the Commission has modified or eliminated a number of these Rules and Regulations. Currently, the Commission's Rules and Regulations, as found in 47 Code of Federal Regulations, Section 76, cover such matters as the use of aeronautical frequencies (47 C.F.R §§76.610, 76.612, 76.618, 76 619), and technical standards (47 C.F.R. §§74.641, 76.601, 76.605, 76.609-76.619), as well as other matters.

In the 1980's a conflict arose between cable television operators and the aviation industry because the frequencies used by the cable television operators to transmit television signals overlapped those used by the aviation industry. When signals above a certain power level "leak" from a cable plant into the atmosphere, they conflict with those used by the aviation industry for communication, etc. Signal leakage can occur in a variety of situations such as when the shielding of cable cracks or becomes weathered, when connectors become loose or when the cable breaks.

In 1985, the Commission adopted a set of technical standards that require cable television operators to monitor their plants for "leakage" of signals from their cables. Of particular relevance is 47 C.F.R. §76.614 which requires cable television operators "transmitting carriers in the frequency bands 108-137 and 225-400 MHz [to] provide a program of regular monitoring for signal leakage by substantially covering the plant every three months." Rule 614 continues with the technical specifications regarding the power measurements that must be made, the requirements for logging the power measurements, and the signal strengths that are allowed if a plant is to continue operation.

To fulfill the requirements of Rule 614, and to maintain control over a cable plant, cable television operators have developed a variety of programs to monitor signal leakage. The most common method is to send a team of repairmen into the field with a bucket truck and a spectrum analyzer. Every three months this team drives the truck along every street where cable is installed. One of the repairmen monitors the readings of the spectrum analyzer while the other one drives. When a signal is encountered that is above that allowed under Rule 614, the source of the signal is located, and the cable is repaired.

Another method of monitoring cable plants include the use of an RF meter to measure signal strength while a driver travels along cable paths. The vehicle used by the driver need not be a bucket truck since no repairs are made at this time. When a signal is encountered that exceeds a designated value, the driver logs the value onto a map for later reference. The map is then provided to a repairman who can repair the leak.

While these methods of monitoring a cable plant meet the requirements of Rule 614, they have certain disadvantages. One problem with the first method is that of cost. The first method incurs the operational expense of a bucket truck and the salaries associated with qualified repairmen. The second method takes advantage of the lower operational cost of the vehicle, and the potentially lower salary of the driver. However, the monitoring of the RF meter and the logging of the measurements is still a manual, time consuming process that is subject to human error.

Cable television operators typically transmit the television signals in the frequency bands 108-137 and 225-400 MHz. The allocation of these frequency bands and the restrictions imposed on operators are governed by Title 47 of the United States Code (i.e., The Communications Act of 1934), and by subsequent regulations adopted by the Federal Communications Commission.

SUMMARY OF THE INVENTION

It is therefore an object of the invention to provide a cost effective automated system for measuring the signal strength of designating frequencies, and logging the measurements in a manner relative to their geographic location.

It is a feature of this invention to combine a signal monitoring device with a geographic location monitoring device and with a controller responsible for reading these devices and for logging information read from these devices.

It is an additional feature of this invention to automatically log measured signals along with their geographic location in a manner that can be plotted out by location.

A further feature of this invention is to combine a handheld device with a control unit to provide display information to a user, and to allow the user to command the control unit.

It is an advantage of this invention that signal leakages in a cable plant can be measured and logged automatically and inexpensively when the invention is placed in a moving vehicle and driven throughout the plant.

According to the invention, a control unit is electrically connected to a global positioning system (GPS), to an RF meter, and to a keypad, for measuring and logging geographic location information and signal strength information. The control unit includes an IBM or compatible XT computer that communicates over serial data communication links with the GPS, the RF meter and the keypad. The control unit reads longitude and latitude information from the GPS, and signal strength information from the RF meter. The control unit then stores the read information onto a floppy disk for later retrieval. The data on the floppy disk is then used to plot out by geographic location, the strength of the measured signals.

In a preferred embodiment of the invention, a cable leakage monitoring system is provided which includes a system for determining geographic location, a system for measuring the signal strength of radio frequencies and a system connected to the determining system and the measuring system for reading the geographic location and the measured signal strength and storing the location and signal strength in a data file. The data file is then used to plot measured signal strength readings by their geographic location.

One embodiment of the invention utilizes a global positioning system for determining geographic location, an RF detection meter to measure signal strength of radio frequencies, and a control unit to read the geographic location from the global positioning system and the signal strength from the RF detection meter, and store the location and signal strength in a data file on a floppy disk.

An alternative embodiment of the invention utilizes a keypad in combination with a global positioning system, an RF detection meter and a control unit, to monitor and log location and signal strength readings in a data file, and display signal signal strength readings on the keypad. In addition, the keypad can be used to transmit command information to the control unit.

A preferred embodiment of the invention provides a cable leakage monitoring system that is to be placed within a moving vehicle for reading geograpic location information and radio frequency signal strength information, and storing the read information into a delimited text file. The monitoring system includes a global positioning system to determine the longitude and latitude of the monitoring system, an RF detection meter to measure the signal strength of radio frequencies, and a control unit that is electrically connected to the global positioning system and the RF detection meter that reads the longitude and latitude information from the global positioning system, and the measured signal strength from the RF detection meter, and stores the read information into a delimited text file. In addition, a keypad may be added to the monitoring system to provide display to a user of the measured signal strength as well as the ability for the user to transmit commands to the control unit.

In another embodiment of the invention a cable leakage monitoring system is provided that combines a global positioning system, an RF detection meter and a control unit to produce four data files containing signal strength, longitude and latitude information. Each data file relates to a specific group of signal strength readings, with groups divided according to the magnitude of signal strength. The data files are imported into a digital mapping program that plots the geographic location of each of the signal strength measurements.

DETAILED DESCRIPTION OF THE INVENTION

Figure 1:
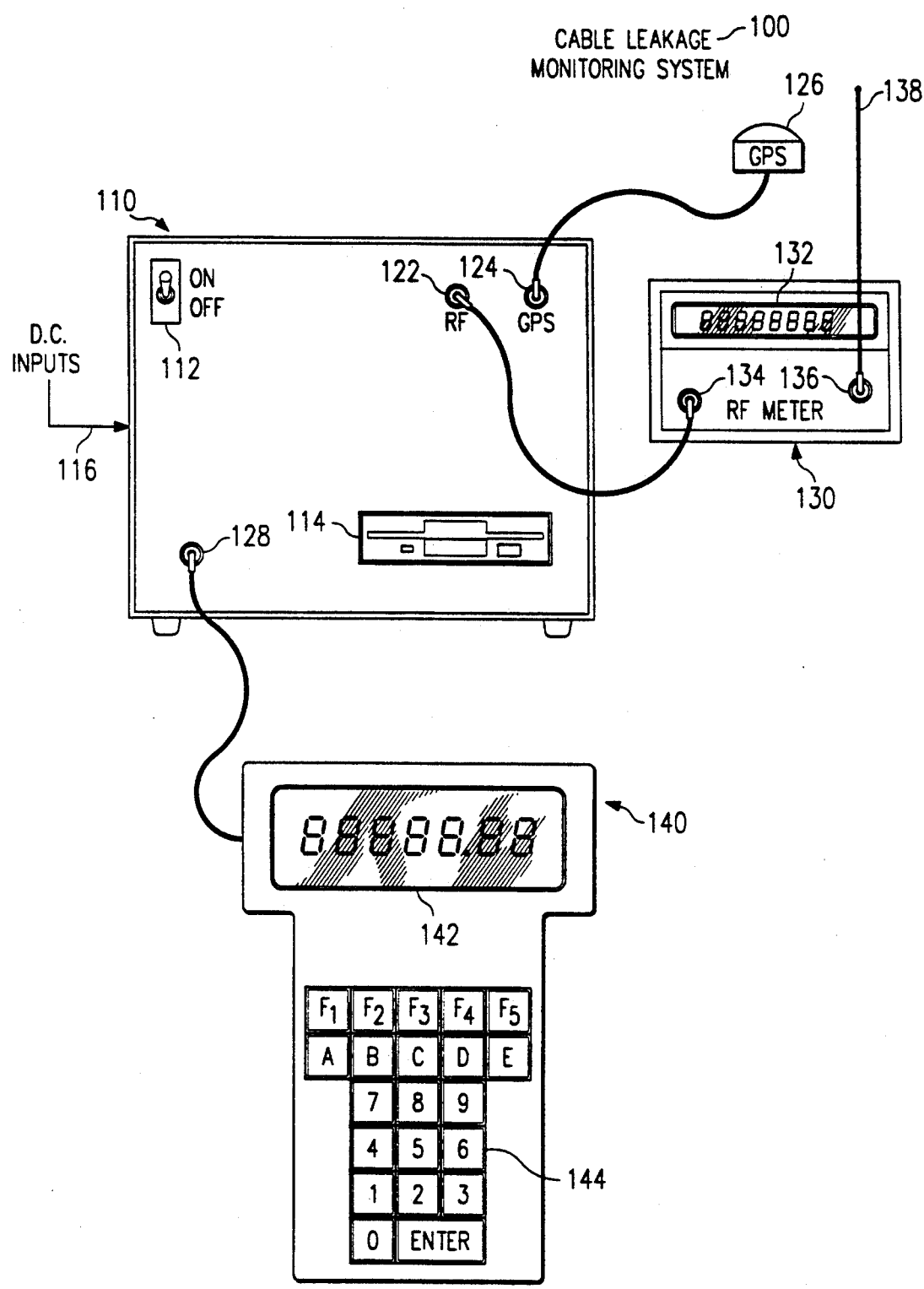
FIG. 1 is a block diagram that shows the hardware components according to the present invention.

Referring to FIG. 1, a cable leakage monitoring system 100 according to the present invention is shown. The monitoring system 100 includes a control unit 110 electrically connected to a global positioning system (GPS) 126 via a connector 124, an RF Meter 130 electrically connected to the control unit 110 via a connector 122, and a hand held keypad 140 electrically connected to the control unit 116 via a connector 128. The GPS 126 provides data to the control unit 110 regarding the geographic location of the control unit at particular points of time. The RF meter 130 provides data to the control unit 110 regarding the signal strength of selected RF signals. The keypad 140 provides an operational interface between the control unit 110 and a user.

In general, the control unit 110 is responsible for requesting and storing information received from the GPS 126 and the RF meter 130. More specifically, the control unit 110 "reads" geographic position information from the GPS 126, and RF signal strength information from the RF meter 130 and stores the position and signal strength information in a data file, as will be further discussed below. The data file can then be used to produce a street map containing signal strength information plotted according to its geographic location, as discussed with reference to FIG. 3.

In one embodiment of the present invention, the control unit 110 contains an IBM or compatible XT computer system (not shown) which includes a power supply, an Intel 8088 or compatible microprocessor, random access memory (RAM), read only memory (ROM), RS-232 (serial) ports and other conventional personal computer hardware. The serial ports of the computer system are electrically connected to the physical connectors 122, 124 and 128. The connector 122 provides an electrical interface between a first serial port of the computer system and the RF meter 130. The connector 124 provides an electrical interface between a second serial port of the computer system and the GPS 126. The connector 128 provides an electrical interface between a third serial port of the computer system and the keypad 140. Thus, via the physical connectors 122, 124 and 128, the computer system is able to transfer to and receive information from the RF meter 130, the GPS 126 and the keypad 140.

In addition, the computer system is electrically connected to a floppy disk drive 114 for storing data on a floppy disk (not shown). In one embodiment of the invention, the floppy disk drive is a 3½" winchester type high density drive capable of storing 1.44 megabytes of information on a 3½" floppy disk. An alternative embodiment utilizes static RAM (not shown) for storing data.

Power to the control unit 110 is provided from an external direct current source (such as a car battery) via a D.C. input line 116. When connected to a D.C. power source, the control unit 110 is activated by moving a power switch 112 to the "on" position. When the control unit 110 is "on," a software program is executed on the computer system in accordance with the flow chart illustrated in FIG. 2, discussed below. The control unit 110 ma be deactivated by moving the power switch 112 to the "off" position.

In one embodiment of the invention, the GPS 126 is an Acutime Model #18636-20 manufactured by Trimble Navigation. The GPS 126 is a sophisticated system for determining its own geographic location (i.e., longitude, latitude and altitude). The GPS 126 acts as an antenna to receive signals from at least three orbiting navigation satellites. The GPS 126 performs triangulation calculations to determine its geographic location. The location information can then be transferred to the control unit 110 via the connector 124.

In one embodiment of the present invention, the RF meter 130 is a model CLM 1000 manufactured by Wavetek. The RF meter 130 measures the signal strength of a pre-selected RF bandwidth and displays the measured signal strength on a display 132. The RF meter 130 includes the display 132, connectors 134 and 136, and an RF antenna 138. The display 132 provides a user interface to the RF meter 130. The connector 134 provides a serial link between the RF meter 130 and the control unit 110. In addition, an electrical path (not shown) for power to be transmitted from the control unit 110 to the RF meter 130 is provided. The connector 136 provides an electrical interface between the RF meter 130 and the antenna 138. The antenna 138 is used to receive RF signals to be measured by the RF meter 130.

The RF meter 130 may be configured to measure signals in a broad spectrum of bandwidths, and may also be configured to display the measured signal strength in a variety of formats. For example, cable television operators are required to monitor carrier signals in the frequency bands 108-137 and 225-400 MHz, pursuant to 47 C.F.R. §76.614. The RF meter 130 may be configured to monitor the signal strength of carrier signals in these frequency bands. In addition, the RF meter 130 can be configured to calculate signal strength measurements based on the distance between the RF meter and the source of the measured signal. The distance to the source of a measured signal may be provided from the control unit 110 to the RF meter 130 via the connectors 122 and 134, as further described below.

The keypad 140 is a handheld command entry and display unit that includes a liquid crystal display 142 and touch sensitive alpha numeric keys 144. The keypad is electrically connected to the control unit 110 via the connector 128. In one embodiment of the invention, the keypad allows a user to enter command sequences to control the operation of the RF meter 130. For example, the $F_1$ function key 144 can be used to start, pause and stop a program that executes on the computer system within the control unit 110. The $F_2$ through $F_5$ keys 144 can transmit predefined measurement distances, via the control unit 110, to the RF meter 130 according to the distance between the RF meter and the source of the signal to be measured. In like manner, a user can also transmit specific measurement distances to the RF meter 130 by entering the distance on the numeric keys 144. These and other uses of the keypad 140 will be further described with reference to FIG. 2.

Figure 2:
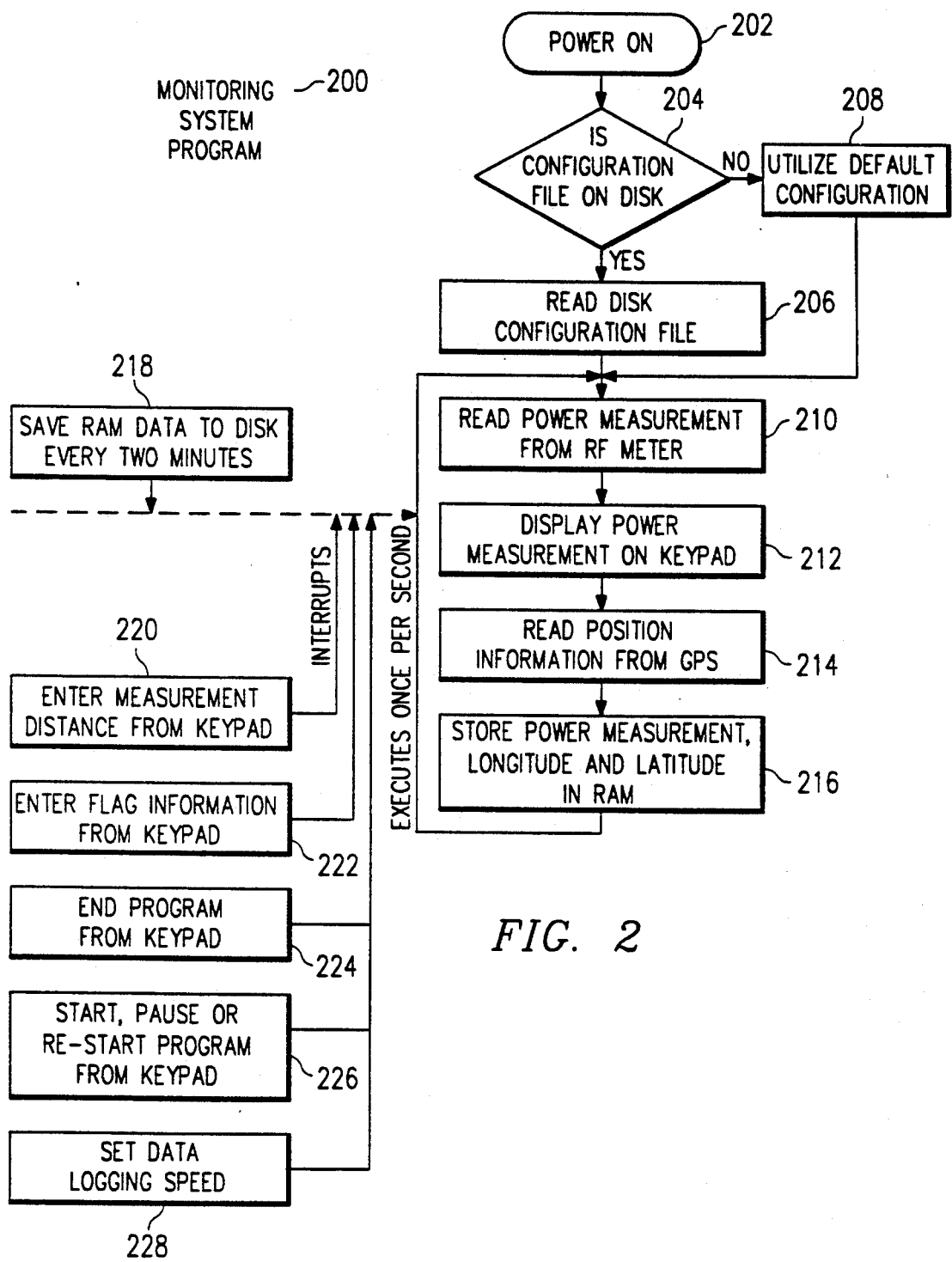
FIG. 2 is a flow chart representing the software method according to the present invention.

Referring to FIG. 2, a monitoring system program 200 according to the invention is shown which is executed on the computer system within the control unit 110. The program 200 controls the reading and storing of information received from the GPS 126, the RF meter 130 and the keypad 140, as well as the display of information to the keypad 140. The reading of information occurs via the serial ports of the computer system that are electrically connected to the connectors 122, 124 and 128. The storing of information is performed by writing information from the computer system to a floppy disk (not shown) within the floppy disk drive 114. The display of information is performed by transmitting read information from the RF meter 130 to the keypad 140 via the serial port that is connected to connector 128.

In general, the monitoring program 200 "reads" signal strength information (e.g., power) from the RF meter 130, via the serial link created by the connectors 122 and 134, and geographic location information (e.g., longitude and latitude) from the GPS 126 via the serial link created by the connector 124. The program then extracts the read information and stores it in one of four comma delimited text files on a floppy disk. The four files pertain to a range of signal strengths. In one embodiment of the invention the four files pertain to signal strength ranges: (1) 0-19 $\mu$V/m; (2) 20-49 $\mu$V/m; (3) 50-149 $\mu$V/m; and (4) 150 $\mu$V/m and up.

At step 202, the control unit 110 is powered on via the power switch 112. At this point, power is provided via the control unit to the computer system, to the GPS 126 via the connector 124, to the RF meter via the connector 122 and to the keypad via the connector 128. Upon power up, the computer system executes conventional diagnostics and proceeds to step 204.

At step 204, the computer system of the control unit 110 reads the floppy disk within the floppy disk drive 114 to determine whether a configuration file (not shown) exists. The configuration file is an editable DOS text file that can be placed on the floppy disk to initialize various parameters of the cable leakage monitoring system 100. One such parameter includes the default distance between the RF meter 130 and the source of the measured signal. Another such parameter includes a distance at which measurements from the RF meter 130 will be appended with an "*" within one of the four comma delimited text files. This "*" is designated as the "DMARK." The DMARK is used to annotate that measurements are being taken by the RF meter 130, when the meter is set at a high sensitivity threshold. For example, measurements made at distances greater than 100 feet, may read 25 $\mu$V/m while the same reading taken at 20 feet may read 8 $\mu$V/m. This DMARK can then be imported along with the measured signal into a mapping program for display, as further described with reference to FIG. 3. If a configuration file exists on the floppy disk, the computer system proceeds to step 206. At step 206, the configuration file is read into the memory (RAM) of the computer system. The designated parameters associated with the configuration file are then transferred from a serial port on the computer system, via the connectors 122 and 134, to the RF meter 130. Upon receipt of the parameters, the RF meter 130 begins measuring the designated frequencies, and calculates the power of the designated frequencies according to the distance parameter provided. If, at step 204, a configuration file does not reside on the floppy disk, a default configuration file is read, at step 208, from the ROM of the computer system and transferred to the RF meter 130, as above. The computer system then proceeds to step 210.

At step 210, the computer system of the control unit 110 reads the power measurement from the RF meter 130 via the serial link created by the connectors 122 and 134. Typically, this power measurement is in numerical units such as 50 $\mu$V/m. The power measurement is based on the distance between the RF meter 130 and the source of the measured signal, and relates to the designated frequency band. The computer system then proceeds to step 212.

At step 212, the computer system of the control unit 110 transmits for display the read power measurement from the control unit to the keypad 140 via the serial link created by the connector 128. At this point, a user of the monitoring system 100 can examine the display 142 of the keypad 140 to determine the measured signal strength of the designated frequency band. The computer system then proceeds to step 214.

At step 214, the computer system of the control unit 110 reads geographical position information from the GPS 126 via the serial link created by the connector 124. The geographical position information includes longitude, latitude, altitude and time. The computer system then proceeds to step 216.

At step 216, the computer system of the control unit 110 stores the power measurement read at step 210, along with the longitude and the latitude geographic information read at step 214, into a RAM area within the computer system. In one embodiment of the invention, the information is stored as a comma delimited text file (e.g., power, longitude, latitude). The computer system then forms a continuous processing loop by proceeding back to step 210. In one embodiment of the invention, the processing loop including steps 210 through 216 executes once per second. Thus, every second the computer system reads a power measurement form the RF meter 130, geographic information from the GPS 126, and stores the power measurement, the longitude and the latitude into a comma delimited text file. This process continues until the control unit is turned off, paused, or until an end command is entered, as discussed below.

The monitoring system program 200 contains several interrupt routines that are designated as steps 218 through 224. The first, step 218, interrupts the continuous loop of steps 210 through 216 every two minutes for the purpose of permanently storing onto the floppy disk within the floppy disk drive 114, the comma delimited text file that has been stored in RAM. This step provides data backup to the computer system such that if power is lost, no more than two minutes of data will be lost. In one embodiment of the invention, the computer system performs some processing on the comma delimited text file before storing it to disk. The processing begins when the computer system examines the text file to determine the value of the measured power signal for each second of time. The computer system extracts the comma delimited text file into one of the four different text files discussed above according to predefined signal strength criteria. For example, one text file may contain power, longitude and latitude for power measurements between 0 and 19 $\mu V/m$, a second text file may contain power measurements between 20 and 49 $\mu V/m$, a third text file may contain power measurements between 50 and 149 $\mu V/m$, and a fourth text file may contain power measurements above 149 $\mu V$. After extracting the delimited text file in RAM into four different text files, the computer system stores these files onto the floppy disk. The computer system then continues the execution loop of steps 210 and 216.

When the computer system, at step 218, stores the text files to disk, it first reads the floppy disk to determine whether any comma delimited text files already exist. If text files do exist on the floppy disk pertaining to the four signal strength designations, the computer step 218 appends the new files onto the preexisting files. Thus, no preexisting files are written over by the computer system. If no text files exist on the floppy disk during the execution of step 218, the computer system creates the files and stores the comma delimited text within them.

A second interrupt, step 220, occurs when a user wishes to change the distance between the RF meter 130 and the measured signal. A user may wish to change the distance measurement to provide more accurate power readings depending on the distance to the source of the measured signal. In one embodiment of the invention, step 220 begins execution either when a user presses the D key 144, on the keypad 140, or when the user presses the $F_2$ through $F_5$ keys 144. The signal is transmitted from the keypad 140 to the computer system within the control unit 110 via the serial link created by the connector 128 When a user presses the D key 144, he must then enter a two or three digit number corresponding to the number of feet between the RF meter 130 and the source of the measured signal. In a cable television environment, this distance would be the number of feet between the RF meter 130 and the television cable, whether above ground or buried. The user transmits the distance number to the computer system within the control unit 110 by pressing the ENTER key 144 on the keypad 140. The number is received by the computer system, via the connector 128, and then transmitted to the RF meter 130 via connectors 122 and 134. Upon receipt, the RF meter 130 calculates the measured power according to the new distance. The user may alternatively choose to enter predefined distances into the RF meter 130 by selecting from one of four predefined distance values corresponding to function keys $F_2$ through $F_5$. If one of these function keys is pressed, a predefined distance is transmitted, via the control unit 110, to the RF meter 130 in the manner described above.

A third interrupt, step 222, provides a user with the ability to create other comma delimited text files according to his own criteria. The other text files are termed "flag files" and contain a flag letter (e.g., A, B or C) as well as longitude and latitude. This capability allows a user to log to the floppy disk location information of particular observable information such as a broken cable (flag A), a damaged pedestal (flag B), etc. The files are created when a user presses the A, B or C keys 144 on the keypad 140. When one of these keys is pressed, the key is transmitted to the computer system within the control unit 110, via the connector 128. The computer system stores the key, along with the most recently read longitude and latitude, into a comma delimited text file on the floppy disk. The computer system appends subsequent key pressings into existing text files in the manner described above.

A fourth interrupt is provided at step 224 which allows a user to end the program 200, and thus end the logging of power measurements to the floppy disk. The user can end the program 200 by pressing the E key 144 on the keypad 140. The key is transmitted to the computer system via the connector 128. Upon receipt, the computer system stores the existing text files onto the floppy disk, discontinues reading the GPS 126 and the RF meter 130, and halts program execution. In one embodiment of the invention, the computer system cannot begin executing again the monitoring system program 200 until power is turned off and then back on.

A fifth interrupt is provided at step 226 which allows a user to start, pause or restart the monitoring program 200 from the keypad 140. A user can toggle between program execution and program pause by pressing the F₁ key 144 on the keypad 140. If the program 200 has been paused, by step 226 for example, the program may be restarted by pressing the F₁ key 144, which transmits a command from the keypad 140 to the computer system via the serial link created by the connector 128. If the program 200 is already being executed, pressing the F₁ key 144 causes the program to pause or suspend execution.

A sixth interrupt is provided at step 228 which allows a user to set the speed at which power and position information are read from the GPS 126 and the RF meter 130 and stored to RAM. In one embodiment of the invention, a user can set the read and log speed to be once per second, once every two seconds or once every three seconds. A user may change the speed settings by pressing the 1, 2, or 3 keys 144 on the keypad 140. When the 1, 2, or 3 key 144 is pressed, the key is transmitted from the keypad 140 to the computer system via the connector 128. The computer system then logs data at a rate corresponding to the transmitted key.

In addition to the above interrupts, a supervisory interrupt (not shown) is provided which produces an error log of particular error conditions that may occur within the control unit. An example of such an error condition is the failure by any one of the GPS 126, the RF meter 130, or the keypad 140 to communicate with the computer system within the control unit 110. The error log is a text file that details the nature of the error and is stored on the floppy disk within the floppy disk drive 114.

Figure 3:
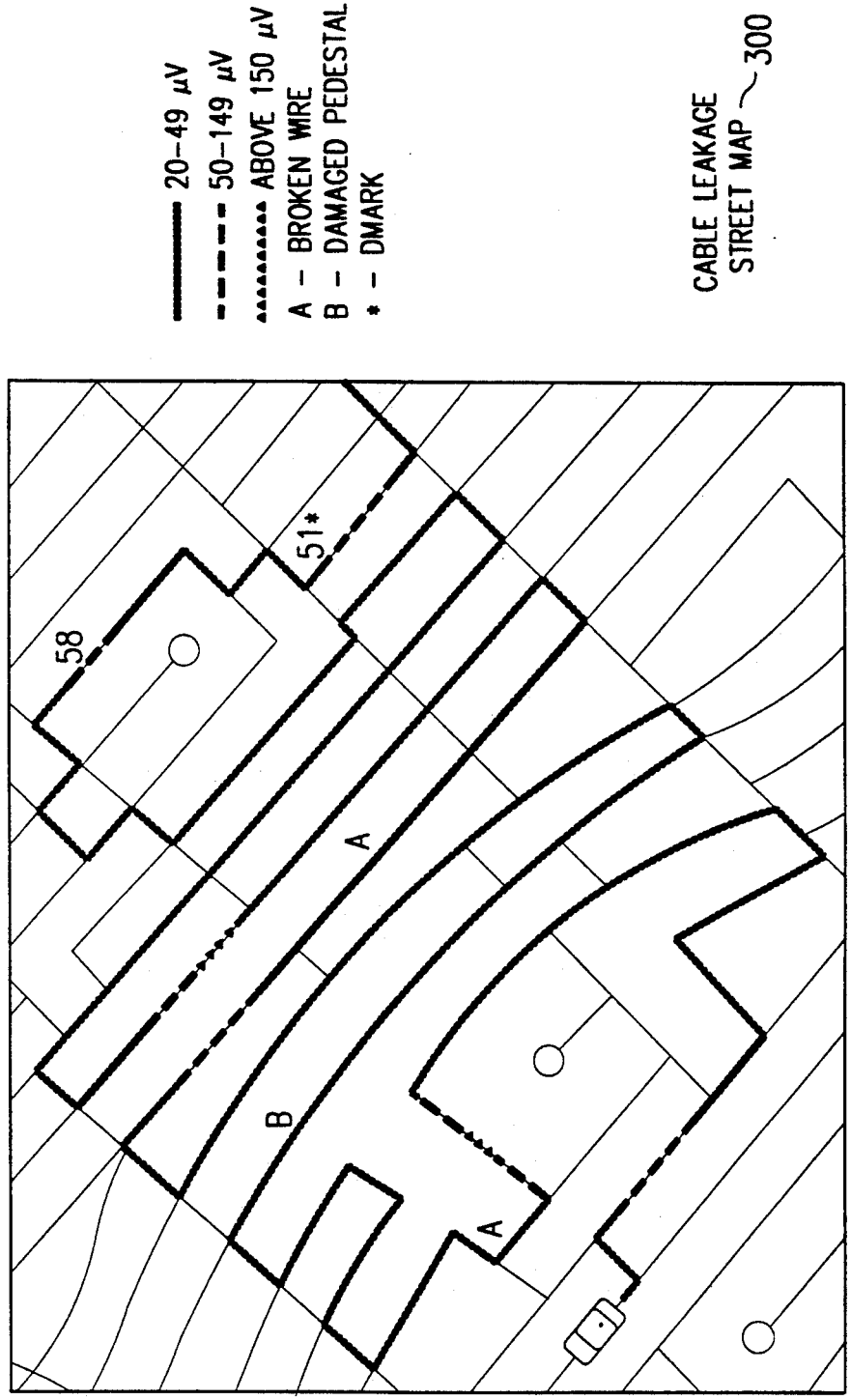
FIG. 3 is a geographic representation of a street map demonstrating the mapping data generated according to the present invention.

Referring to FIG. 3, a cable leakage street map 300 map is shown that corresponds to the data that was logged onto the floppy disk by the monitoring system program 200. The map 300 illustrates the power measurements by geographic location that were logged according to the invention as well as flag locations and DMARK locations. As discussed above, four power measurement text files were created on the floppy disk by the program 200. These text files contain power measurements and geographic location information in comma delimited format (e.g., power, longitude, latitude, power, longitude, etc.). To create the map 300, a user takes the text files stored on the floppy disk within the floppy disk drive 114 and imports the files into a digital mapping program such as MapInfo developed by MapInfo Corporation. MapInfo is a software program that can be purchased by a user and executed on a personal computer. A user can purchase from MapInfo Corporation, county by county street maps in digital form. The MapInfo program relates all of the streets in the program to longitude and latitude values. By utilizing a MapInfo import feature, a user can import into the MapInfo program the comma delimited text files that are stored on the floppy disk. The MapInfo program reads the longitude and latitude values that were logged to the text files, and plots them out onto MapInfo street maps. In addition, the longitude and latitude values in the text files can be represented in MapInfo as different graphical characters. By separating the power measurements into four different text files, four different graphical representations of the text files can be shown in MapInfo. In FIG. 3, three different graphical representations are shown. The first graphical representation is a small dashed line which pertains to power measurements between 20 and 49 μV. A second graphical representation is a large dashed line which pertains to power measurements between 50 and 149 μV. A third graphical representation is a line of triangles which pertains to power measurements of 150 μV or above.

The other text files that were created by the monitoring program 200 may also be imported into the MapInfo program for representation on street maps. For example FIG. 3 contains several references to the flag characters A and B that were extracted from the flag files and displayed according to their geographic location. In addition, signal strength readings that were made at distances greater than the predefined DMARK distance are illustrated with an *.

The result of the combination of the text files created by the invention with the MapInfo program is a street by street graphical representation of power measurements within predefined frequency bands along with flag and DMARK information. This street map may be provided to a repairman who is responsible for repairing signal leaks above a certain threshold.

It is understood that variations may be made in the invention without departing from the spirit and scope of the invention. For example, the GPS 126 may alternatively use a LORAN navigation system, or an ETAK mapping system for determining geographical location information. In addition, the RF meter 130 may alternatively use a different power meter or a spectrum analyzer capable of transferring power readings to a computer system. Furthermore, the serial communications established between the control unit 110, the GPS 126, the RF meter 130 and the keypad 140 may utilize other serial communication standards such as RS-422, or parallel means of communication such as IEEE-488, or possibly infrared communication. In addition, the control unit 110 may alternatively use other computer systems with sufficient I/O capabilities to support the external devices. One alternative may be a laptop computer.

Although illustrative embodiments of the present invention have been shown and described, a latitude of modification, change and substitution is intended in the foregoing disclosure and in some instances some features of the invention will be employed without a corresponding use of other features. Accordingly, it is appropriate that the appended claims be construed broadly and in a manner consistent with the scope of the invention.

What is claimed:

1. A cable leakage monitoring system comprising:
   means for determining the geographic location of said monitoring system;
   means for measuring the signal strength of radio frequency signals;
   means, electrically connected to said determining means and said measuring means, for reading said geographic location from said determining means, and said signal strength from said measuring means, and storing said read geographic location and said strength in a data file; and
   a keypad electrically connected to said reading and storing means for sending information to said reading and storing means, wherein said information comprises the distance between said measuring means and a source of said radio frequency signals.

2. The cable leakage monitoring system of claim 1 wherein said determining means comprises a global positioning system.

3. The cable leakage monitoring system of claim 1 wherein said measuring means comprises an RF detection meter.

4. The cable leakage monitoring system of claim 3 wherein said RF detection meter comprises:
   an antenna;
   a signal strength meter electrically connected to said antenna; and
   a connector for electronically transferring information to and receiving information from said meter.

5. The cable leakage monitoring system of claim 1 wherein said reading and storing means comprises:
   computer means for controlling the reading and storing of said read geographic location and said signal strength; and
   means, electrically connected to said computer means, for storing said read geographic location and said signal strength.

6. The cable leakage monitoring system of claim 1 wherein said data file comprises a delimited text file that may be stored on a floppy disk.

7. The cable leakage monitoring system of claim 1 wherein said keypad also displays information received from said reading and storing means.

8. The cable leakage monitoring system located within a moving vehicle for logging geographic location and radio frequency signal strength into a data file comprising:
   a geographic location system for determining the geographic location of said monitoring system;
   a radio frequency detection system for measuring the signal strength of said radio frequency signals;
   a control unit, electrically connected to said geographic location system and to said radio frequency detection system, for reading geographic location information from said location system and signal strength information from said radio frequency detection system, and storing said read information in a data file; and
   a keypad, electrically connected to said control unit, for sending information to said control unit, wherein said information that is sent to said control unit comprises the distance between said radio frequency detection system and a source of said radio frequency signals.

9. The cable leakage monitoring system of claim 8 wherein said geographic location system comprises a global positioning system.

10. The cable leakage monitoring system of claim 8 wherein said radio frequency detection system comprises:
    an antenna;
    a signal strength meter electrically connected to said antenna; and
    a connector for electronically transferring information to and receiving information from said meter.

11. The cable leakage monitoring system of claim 8 wherein said control unit comprises:
    a computer system for controlling the reading and storing of said read geographic location information and said signal strength information; and
    a storage system, electrically connected to said computer system, for storing said read geographic location information and said signal strength information.

12. The cable leakage monitoring system of claim 8 wherein said data file comprises a delimited text file that may be stored on a floppy disk.

13. The cable leakage monitoring system of claim 8 wherein said keypad also displays information received from said control unit.

14. The cable leakage monitoring system to be placed in a moving vehicle for reading geographic location information and radio frequency signals strength information, and storing said read information into a delimited text file, the system comprising:
    a global positioning system for determining the longitude and latitude of said monitoring system;
    a radio frequency detection system for measuring the signal strength of said radio frequency signals;
    a control unit, electrically connected to said global positioning system and to said radio frequence detection meter, for reading said longitude and latitude from said global positioning system, and reading said measured signal strength from said radio detection meter, and storing said read information into said text file; and
    a keypad, electrically connected to said control unit, for sending information to said control unit, wherein said information that is sent to said control unit comprises:
    flag information for logging broken cables or damaged pedestals, said flag information being stored with said read information in said text file;
    program pause and restart commands for pausing and restarting said reading and said storing of information; and
    a program end command for stopping the reading and storing of said information.

15. The cable leakage monitoring system of claim 14 wherein said control unit further comprises:
    an IBM or compatible computer system for controlling the reading and storage of said longitude, latitude and signal strength; and
    a floppy disk drive for storing said text file.

16. The cable leakage monitoring system of claim 14 wherein said delimited text file comprises a plurality of delimited text files such that each text file relates to different signal strength groups.

17. The cable leakage monitoring system of claim 14 wherein said text file may be imported into a digital mapping program for display of said stored information.

18. The cable leakage monitoring system of claim 14 wherein said read information is read from said global positioning system and said radio frequency detection meter at least once every three seconds.

19. The cable leakage monitoring system of claim 14 wherein said information sent to said control unit from said keypad comprises the distance between said radio frequency detection meter and a source of said radio frequencies.

20. The cable leakage monitoring system of claim 14 wherein said keypad also displays information received from said control unit.

21. The cable leakage monitoring system to be placed in a moving vehicle for reading longitude, latitude and radio frequency signal strength information, and storing said read information into delimited text files for import into a digital mapping system, the system comprising:
    a global positioning system for determining the longitude and latitude of said monitoring system;
    a radio frequency detection system for measuring the signal strength of said radio frequency signals;
    a control unit, electrically connected to said global positioning system and to said radio frequence detection meter, for reading said longitude and latitude from said global positioning system, and reading said measured signal strength from said radio detection meter, and storing said read information into said text file; and a keypad, electrically connected to said control unit, for transmitting information to said control unit and displaying information received from said control unit, wherein said transmitted information comprises the distance between said radio frequency detection meter and a source of said radio frequency signals and flag information for logging broken cables or damaged pedestals, said flag information being stored with said read information in said text files.

22. The cable leakage monitoring system of claim 21 wherein said transmitted information further comprises:

program pause and restart commands for pausing and restarting said reading and storing of information; and a program end command for stopping the reading and storing of said information.

* * * * *